United States Patent
Hirabayashi

(10) Patent No.: US 6,331,473 B1
(45) Date of Patent: Dec. 18, 2001

(54) SOI SUBSTRATE, METHOD FOR MAKING THE SAME, SEMICONDUCTIVE DEVICE AND LIQUID CRYSTAL PANEL USING THE SAME

(75) Inventor: Yukiya Hirabayashi, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 09/559,822

(22) Filed: Apr. 28, 2000

Related U.S. Application Data

(62) Division of application No. 09/221,999, filed on Dec. 29, 1998.

(51) Int. Cl.[7] .......................... H01L 21/30; H01L 21/46; H01L 21/00
(52) U.S. Cl. .......................... 438/455; 438/72; 438/158; 438/164
(58) Field of Search .................................. 738/455, 456, 738/458, 459, 151, 158, 164, 72

(56) References Cited

U.S. PATENT DOCUMENTS

| | | |
|---|---|---|
| 4,984,033 | 1/1991 | Ishizu et al. . |
| 5,281,840 * | 1/1994 | Sama .................................... 257/351 |
| 5,374,564 | 12/1994 | Bruel . |
| 5,635,707 * | 6/1997 | Shimizu ............................. 250/214.1 |
| 5,771,110 * | 6/1998 | Hirano et al. ........................... 257/72 |
| 5,811,866 * | 9/1998 | Hirata ................................... 257/435 |
| 5,886,364 * | 3/1999 | Zhang .................................... 257/53 |
| 5,953,584 | 9/1999 | Lim et al. . |
| 5,966,620 * | 10/1999 | Sakaguchi et al. .................. 438/455 |

FOREIGN PATENT DOCUMENTS 4-346418   12/1992   (JP) .

* cited by examiner

Primary Examiner—John F. Niebling
Assistant Examiner—Viktor Simkovik
(74) Attorney, Agent, or Firm—Oliff & Berridge, PLC

(57) ABSTRACT

A bonded SOI substrate is disclosed using a transparent electrode without causing generation of a leakage current by light in semiconductive devices formed on the substrate when light is incident on the rear face of the substrate, resulting in decreased deterioration of device characteristics and malfunction. A shielding layer is formed between a transparent supporting substrate and a single-crystal silicon layer of an SOI substrate that can shield light incident on the rear face of the substrate. The light shielding layer is preliminarily formed on the supporting substrate prior to bonding of the single-crystal silicon layer to the supporting substrate in an SOI production process by a bonding method.

6 Claims, 11 Drawing Sheets

(a)

(b)

(c)

(d)

(e)

(f)

(g)

(a)

(b)

(c)

(d)

(e)

(a)

(b)

(c)

(d)

(e)

(f)

SOI SUBSTRATE, METHOD FOR MAKING THE SAME, SEMICONDUCTIVE DEVICE AND LIQUID CRYSTAL PANEL USING THE SAME

This is a Division of Application Ser. No. 09/221.999 filed Dec. 29, 1998, which is pending. The entire disclosure of the prior application is hereby incorporated by reference herein in its entirety.

BACKGROUND OF THE INVENTION

1. Field of the Invention

The present invention relates to silicon-on-insulator (SOI) substrates, and specifically to an SOI substrate using a transparent supporting substrate, a method for making the same, a liquid crystal panel, and an electronic device using the SOI substrate.

2. Description of Related Art

Since SOI technologies including formation of a silicon thin film on an insulating substrate and formation of a semiconductive device on the silicon thin film have advantages such as high speed response of devices, low electrical energy consumption, and high integration density, they have been widely studied.

One SOI technology is production of an SOI substrate including bonding single-crystal silicon substrates. The method, generally called a bonding method, includes bonding a single-crystal silicon substrate and a supporting substrate by means of hydrogen bonding, reinforcing the bonding strength by heat treatment, and forming a thin film single-crystal silicon layer by grinding, polishing or etching of the single-crystal silicon substrate. Since this method is capable of directly thinning the single-crystal silicon substrate, the resulting silicon thin film has high crystallinity and thus enables production of a high performance device.

Furthermore, applied bonding methods have been known, such as, for example, a method for doping hydrogen ions on a single-crystal silicon substrate, bonding it with a supporting substrate, and separating a thin film silicon layer from the hydrogen-doped region of the single-crystal silicon substrate by heat treatment (U.S. Pat. No. 5,374,564); and a method for epitaxially growing a single-crystal silicon layer on a silicon substrate with a porous surface, bonding it to a supporting substrate, removing the silicon substrate, and etching the porous silicon layer to form an epitaxial single crystal silicon thin film on the supporting substrate (Japanese Patent Application Laid-Open No. 4-346418). SOI substrates by bonding methods have been used in production of various devices, as well as general bulk semiconductive devices. An advantage of the SOI substrate not achieved by conventional bulk substrates is allowing the use of various materials as supporting substrates. That is, transparent quartz and glass substrates, in addition to general silicon substrates, can be used as supporting substrates. Formation of a single-crystal silicon thin film on a transparent substrate enables formation of devices requiring light transmissivity, for example, high-performance transistor devices using single crystal silicon in a transmissive liquid crystal display device.

In an SOI substrate including a transparent supporting substrate and a single-crystal silicon thin film bonded thereto, the single-crystal silicon layer is used as source and drain regions in transistor devices, such as metal oxide semiconductor field effect transistors (MOSFETs). When the substrate is transparent, light incident on the rear face of the substrate causes current leakage in the channel region of the MOSFET, and thus causes deterioration of device characteristics. (Herein the face of the substrate provided with the single-crystal silicon layer is called the front face, and the reverse face is called the rear face).

This will be described with reference to the drawings. FIG. 2 is a cross-sectional view of an SOI substrate provided with a transparent substrate produced conventionally. The SOI substrate has a configuration in which a single-crystal silicon layer 2 is bonded to a supporting substrate 1 with an oxide layer 3 therebetween. Since the oxide layer 3 generally transmits light, a conventional SOI substrate using a transparent material, such as quartz and glass, as a supporting substrate is not provided with a light shielding layer under the single-crystal silicon layer 2.

FIG. 3 is a cross-sectional view of a MOSFET produced using the conventional SOI substrate shown in FIG. 2. The oxide layer 3 is provided on the supporting substrate 1, and a source region 2b, a channel region 2a, and a drain region 2c of the MOSFET are formed by patterning of the single-crystal silicon layer. The single-crystal silicon layer is covered with a gate insulating film 2d formed by surface oxidation thereof. A gate electrode is provided on the gate insulating film 2d, and the single-crystal silicon layer and the gate electrode 6 of the MOSFET are covered with a first interlayer 7. The source region 2b and the drain region 2c are connected to a source line 9 and a drain line 8, respectively, through openings in the first interlayer 7. A second interlayer 10 is formed thereon, and an upper light shielding layer 11 is formed on the second interlayer 10. The upper light shielding layer 11 is formed of a nontransparent insulating material such as a polyimide resin or a metallic thin film such as aluminum. When light 12a is directly incident on the front face of the substrate, the upper light shielding layer 11 suppresses leakage of the light 12a to the channel region 2a of the MOSFET provided on the substrate. When light 12c is directly incident on the rear face of the substrate, leakage of the light to the channel region 2a of the MOSFET is not prevented. Light 12b reflected on the rear interface la of the substrate partly reaches the channel region 2a of the MOSFET and causes light leakage even if the light is incident on the front face of the substrate.

Since the conventional SOI substrate shown in FIG. 2 has no light shielding layer between the supporting substrate 1 and the single-crystal silicon layer 2, the channel region 2a of the MOSFET composed of a single-crystal silicon thin film using the SOI substrate is not shielded from the light 12c directly incident on the rear face of the substrate and the light 12b reflected on the rear face of the substrate. Thus, light leakage occurs in a MOSFET produced using an SOI substrate having the conventional configuration, resulting in a fundamental problem of deterioration of device characteristics. Accordingly, it is difficult to use a transparent SOI substrate for a device using light and the SOI substrate cannot be used generally.

SUMMARY OF THE INVENTION

It is an object of the present invention to provide an SOI substrate enabling production of a semiconductive device which does not cause light leakage when a transparent supporting substrate is used, and a method for making the same. It is another object of the present invention to provide a high-performance semiconductive device using an SOI substrate using a transparent substrate and which does not cause light leakage.

An SOI substrate in accordance with the present invention, for achieving the above-mentioned objects, is provided with an embedded-type light shielding layer, for preventing light leakage, between a transparent supporting substrate and a single-crystal silicon layer formed thereon. The light shielding layer is formed on one surface of the supporting substrate, and the single-crystal silicon layer is formed on an insulating layer deposited on the light shielding layer. The light shielding layer is patterned so as to cover the channel region of the MOSFETs constituting a device, and is not present in the portion other than the channel region of the MOSFETs. Thus, it can be used in an application requiring light transmittance of the substrate, for example, a transmissive liquid crystal display device. Use of a high melting point metal or a silicon compound (silicide) for the light shielding layer is capable of producing an SOI substrate which is sufficiently stable in a thermal process, such as impurity diffusion into the single-crystal silicon layer, essential for production of MOSFET.

DETAILED DESCRIPTION OF PREFERRED EMBODIMENTS

Preferred embodiments of the present invention will now be described with reference to the drawings.

First Embodiment

Figure 1:
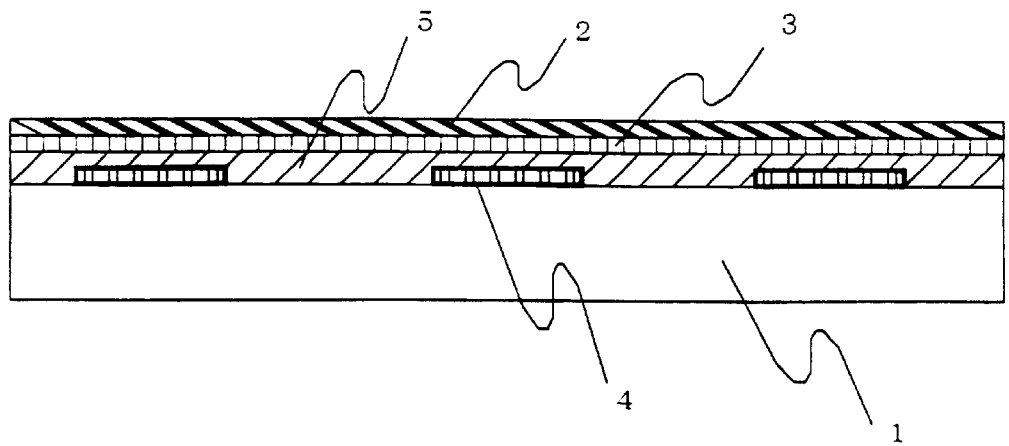
FIG. 1 is a cross-sectional view of an SOI substrate of a first embodiment in accordance with the present invention.
Figure 2:
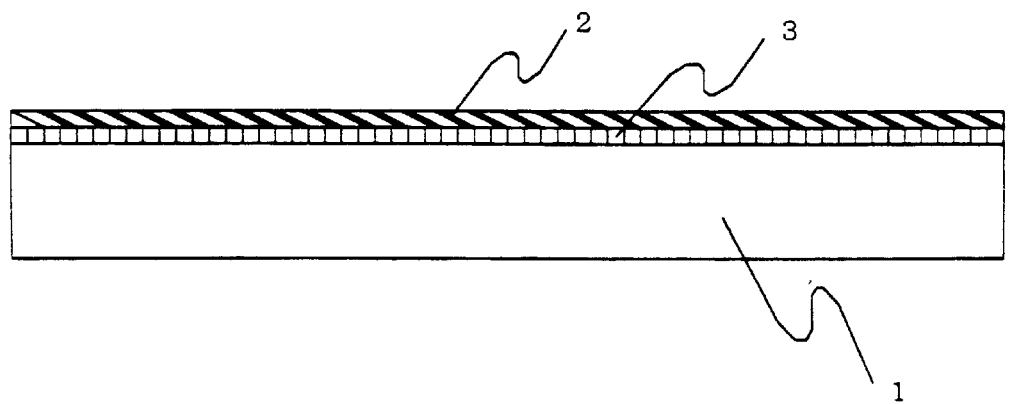
FIG. 2 is a cross-sectional view of an SOI substrate produced by a conventional bonding method.
Figure 3:
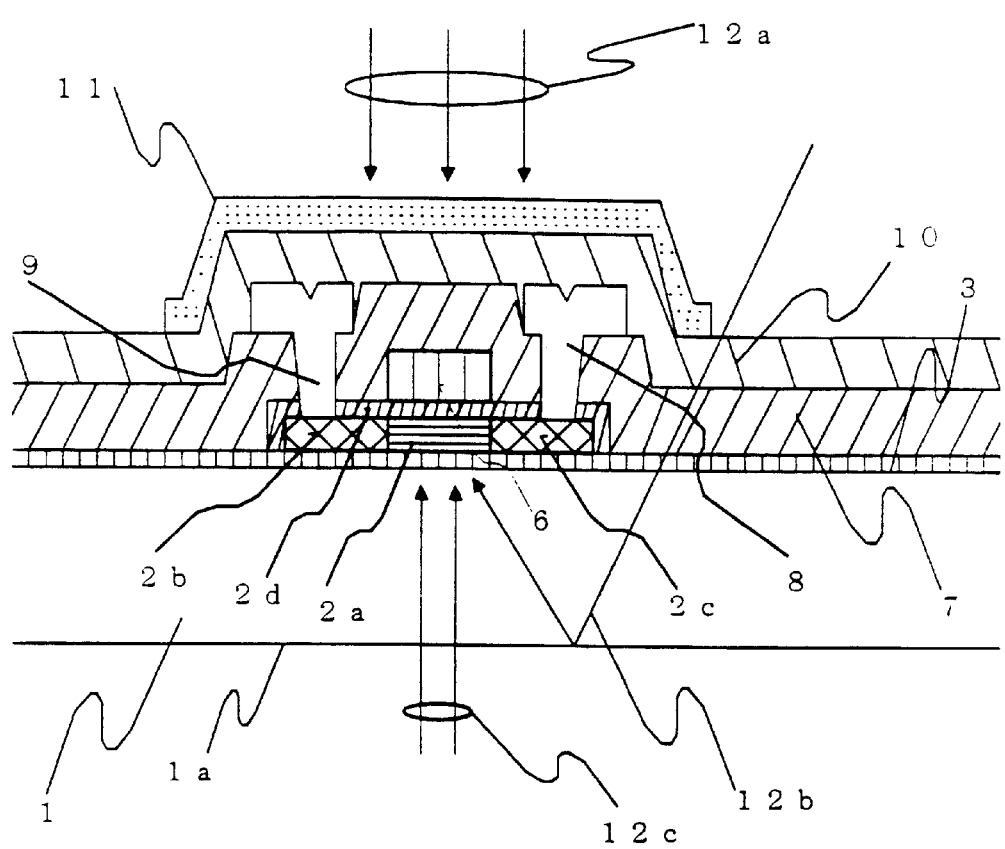
FIG. 3 is a cross-sectional view of a light shielding structure of a MOSFET produced using an SOI substrate by a conventional bonding method.

FIG. 1 is a cross-sectional view of a first embodiment of an SOI substrate in accordance with the present invention.

Figure 4:
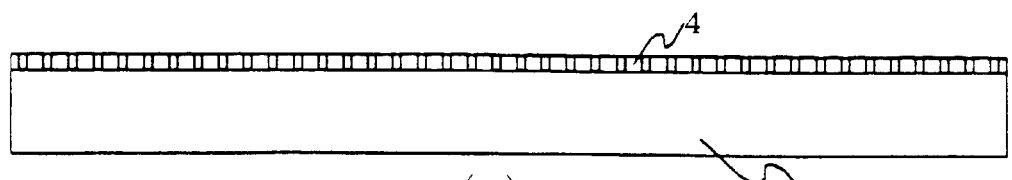
FIGS. 4(a)–(d) show production steps of an SOI substrate in accordance with a first embodiment of the present invention.
Figure 4:
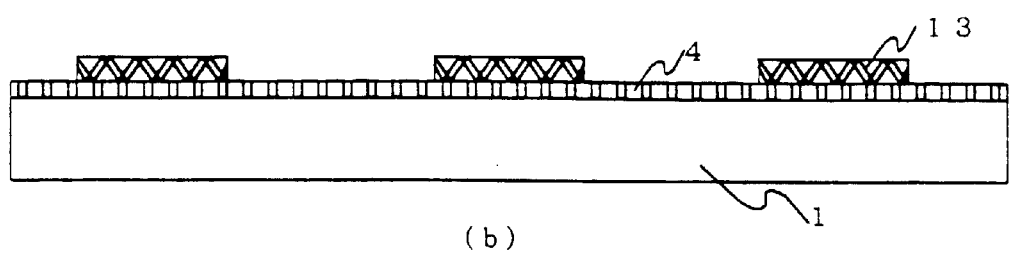
Figure 4:
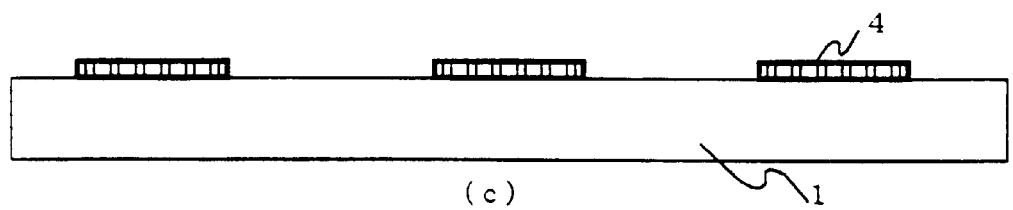
Figure 4:
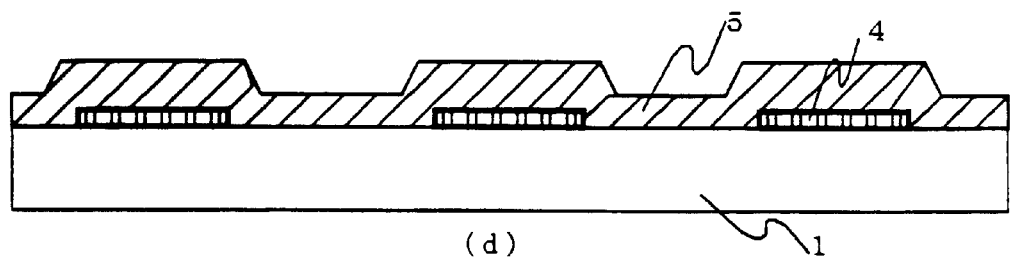
Figure 5:
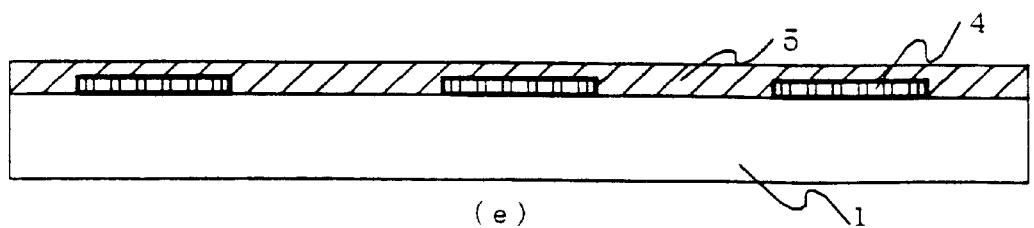
FIGS. 5(e)–(g) show production steps of an SOI substrate in accordance with a first embodiment of the present invention.
Figure 5:
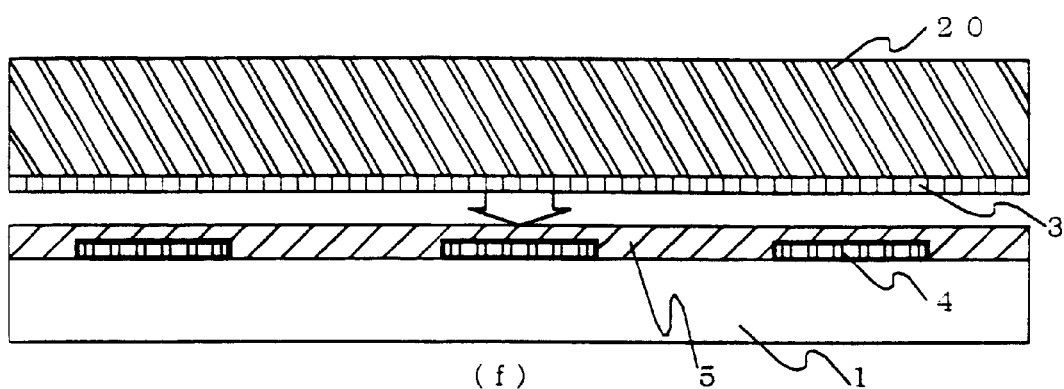
Figure 5:
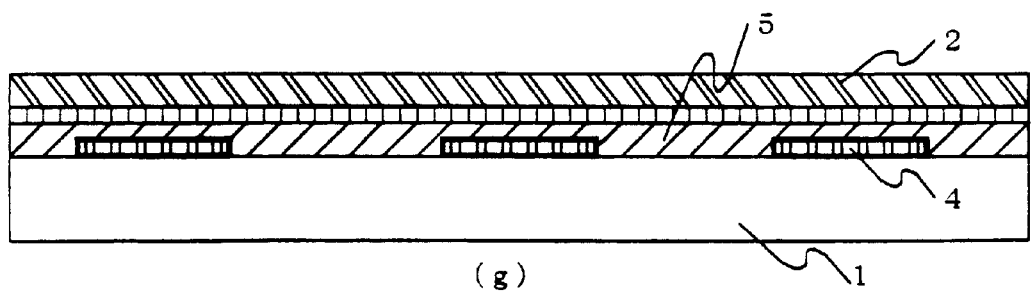

FIGS. 4(a)–(d) and 5(c)–(g) show a method for making the SOI substrate of the first embodiment of the present invention. As shown in FIG. 1, in the SOI substrate of the present invention, a light shielding layer 4 of the transistor device is provided on a transparent supporting substrate 1, and a single-crystal silicon layer 2 is formed on an insulating layer 5 and an oxide layer 3 deposited thereon. A production process of the SOI substrate will be described with reference to FIGS. 4(a)–(d) With reference to FIG. 4(a), a light shielding layer 4 is formed on an entire transparent supporting substrate 1. In this embodiment, quartz with a thickness of 1.1 mm is used as the supporting substrate. The light shielding layer 4 is obtained by depositing molybdenum by a sputtering process to a thickness of approximately 100 to 1,000 nm. In this embodiment, the thickness of the deposited molybdenum was 400 nm. The materials for the light shielding layer 4 are not limited to this embodiment; any material stable at a maximum thermal process temperature for the device produced will not cause problems. Examples of preferred materials include high melting point metals, such as tungsten and tantalum; polycrystalline silicon; and silicides, such as tungsten silicide and molybdenum silicide. Usable forming processes include a CVD process and an electron beam thermal evaporation process, in addition to the sputtering process. With reference to FIG. 4(b), a photoresist pattern 13 to remove the light shielding layer 4 other than a region corresponding to a channel region of a MOSFET will be formed thereon. With reference to FIG. 4(c), the light shielding layer 4 is etched through the photoresist pattern 13 as a mask to remove the light shielding layer other than the transistor-forming region by dry etching. After etching, the photoresist pattern 13 is peeled off. An insulating layer 5 to ensure insulation between the light shielding layer 4 and a single-crystal silicon layer will be formed thereon. The insulating layer used is a silicon oxide film. The silicon oxide film may be formed by, for example, a sputtering process, or a plasma enhanced CVD process using tetraethyl orthosilicate (TEOS). The insulating layer 5 has a thickness that secures sufficient insulation of the single-crystal silicon layer 2 above the light shielding layer 4 after planarization of the steps by the light shielding layer 4. It is preferable that the deposition thickness of the insulating layer 5 be approximately 500 to 1,000 nm larger than the thickness of the light shielding layer 4. In this embodiment, the silicon oxide film is deposited by 1,000 nm by a plasma enhanced CVD process using TEOS on the light shielding layer 4 with a thickness of 400 nm. Since the resulting supporting substrate provided with the light shielding layer has unevenness in response to the formed light shielding layer 4, bonding to a single-crystal silicon substrate forms voids at step sections and causes nonuniform bonding strength. As shown in FIG. 5(e), therefore, the entire surface of the supporting substrate provided with the light shielding layer 4 is planarized by polishing. The polishing planarization is performed by a chemomechanical polishing (CMP) process. In the CMP process, it is preferable that the thickness to be polished of the insulating layer 5 on the light shielding layer 4 be approximately 200 to 700 nm greater than the thickness of the light shielding layer 4. Since the CMP process can decrease the steps at the ends of the light shielding layer pattern to 3 nm or less, bonding of the single-crystal silicon substrate results in uniform bonding strength over the entire substrate. With reference to FIG. 5(f), the supporting substrate provided with the light shielding layer is bonded to a single-crystal silicon substrate 20. The single-crystal silicon substrate 20 to be used has a thickness of 300 $\mu$m, and the surface thereof is preliminarily oxidized to form an oxide layer 3 with a thickness of approximately 0.05 to 0.8 μm. The interface formed between the single-crystal silicon layer 20 and the oxide layer 3 after bonding is formed by thermal oxidation to ensure superior electrical characteristics at the interface. The bonding step may be a step for directly bonding the two substrates by heat treatment, for example, at 300° C. for 2 hours. Although the heat treatment temperature must be raised to approximately 450° C. in order to enhance the bonding strength, direct heating causes formation of defects such as cracks in the single-crystal silicon layer due to great differences in coefficients of thermal expansion of the quartz substrate and the single-crystal silicon layer, and thus deteriorates substrate quality. It is preferable, in order to suppress formation of defects such as cracks, that the single-crystal silicon substrate after heat treatment for bonding at 300° C. be thinned by wet etching or CMP to a thickness of approximately 100 to 150 μm and then be subjected to heat treatment at a higher temperature. In this embodiment, the single-crystal silicon substrate is etched with an aqueous KOH solution at 80° C. until the thickness was 150 μm. The bonded substrates are subjected to heat treatment at 450° C. to increase the bonding strength. Next, as shown in FIG. 5(g), the bonded single-crystal silicon layer 2 is polished to a thickness of 3 to 5 μm.

In the resulting bonded thin film substrate, the single crystal silicon layer 2 is finally etched by a plasma assisted chemical etching (PACE) process to a thickness of approximately 0.05 to 0.8 μm. The PACE process can produce a single-crystal silicon layer 2 having a uniformity within 10% with respect to a thickness of 100 nm. An SOI substrate provided with a light shielding layer is formed by the above-mentioned steps.

Second Embodiment

Figure 6:
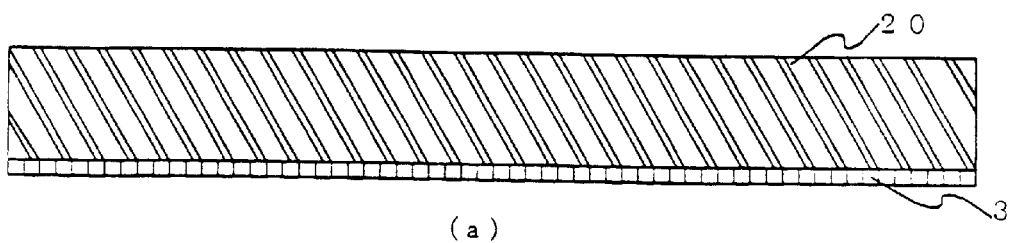
FIGS. 6(a)–(c) show production steps of an SOI substrate in accordance with a second embodiment of the present invention.
Figure 6:
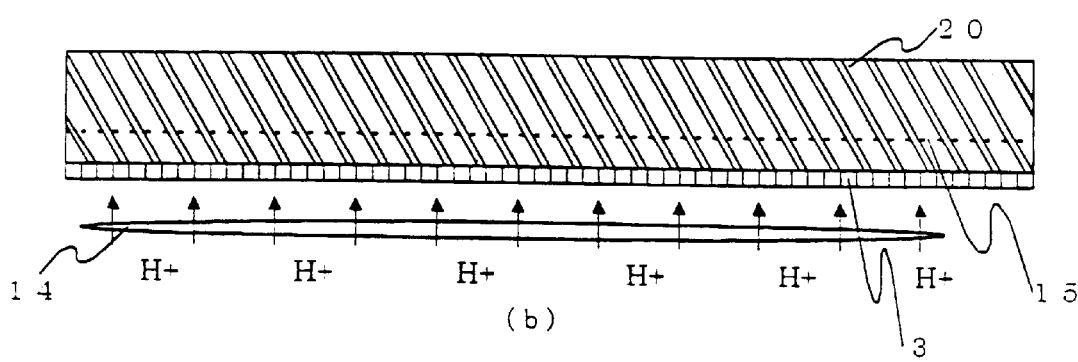
Figure 6:
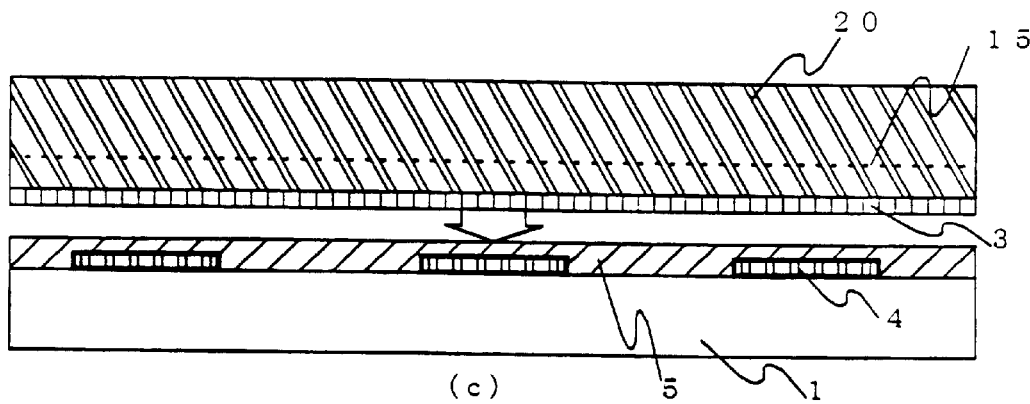
Figure 7:
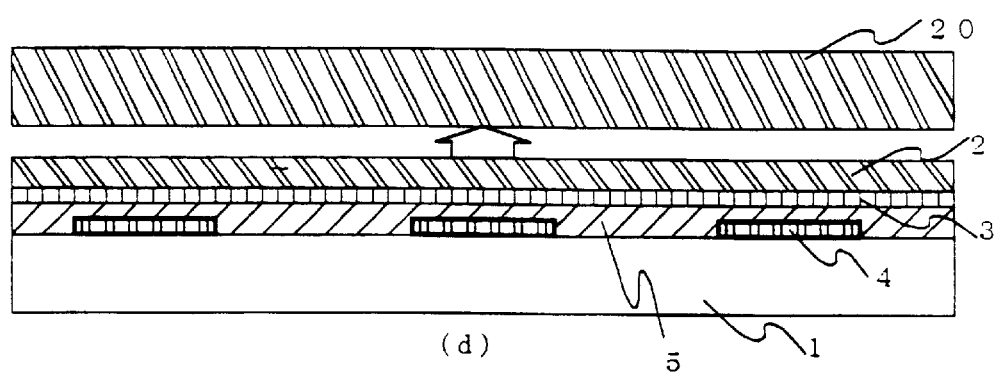
FIGS. 7(d)–(e) show production steps of an SOI substrate in accordance with a second embodiment of the present invention.
Figure 7:
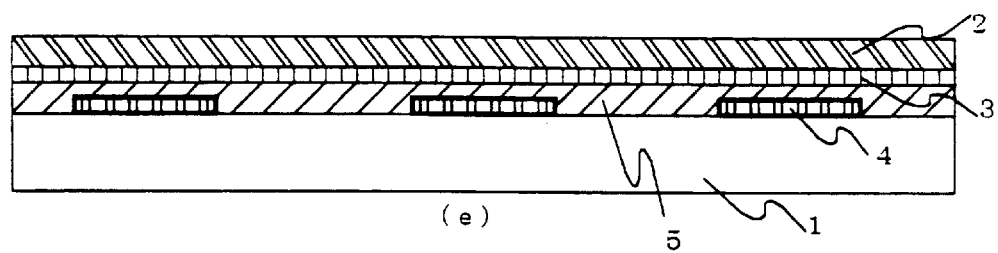

FIGS. 6(a)–(c) and 7(d)–(e) show a second embodiment in accordance with the present invention. The same reference numerals as those in FIGS. 4(a)–(d) and 5(e)–(g) represent the same layers or parts formed by the same steps. In this embodiment, the planarization step of the surface of a supporting substrate with a patterned light shielding layer and the preceding steps are entirely the same as those in the first embodiment. FIG. 6(a) shows a single-crystal silicon substrate used for bonding. The single-crystal silicon layer 20 has a thickness of 600 μm, and the surface is preliminarily oxidized by approximately 0.05 to 0.8 μm to form an oxide layer 3. As shown in FIG. 6(b), the single-crystal silicon substrate 20 is doped with hydrogen ions 14. In this embodiment, hydrogen ions (H+) were implanted at an accelerated voltage of 100 keV and a dose of $10^{16}$ cm$^{-2}$. Such treatment forms a high-hydrogen concentration layer 15 in the single-crystal silicon substrate 20. With reference to FIG. 6(c), the ion-doped single-crystal silicon substrate 20 is bonded to a supporting substrate 1 provided with a light shielding layer 4 and an insulating layer 5. An exemplary bonding step is direct bonding of these two substrates by heat treatment, for example, at 300° C. for 2 hours. With reference to FIG. 7(d), heat treatment for separating the single-crystal silicon substrate 20 from the supporting substrate is performed so that the oxide layer 3 at the bonding face of the single-crystal silicon substrate 20 and the single-crystal silicon layer 2 remain on the supporting substrate. The separation phenomenon of the substrate is caused by rupture of the silicon bonding in a layer in the vicinity of the surface of the single-crystal silicon substrate due to hydrogen ions introduced in the single-crystal silicon substrate. In this embodiment, the two bonded substrates were heated to 600° C. at a heating rate of 20° C./min. The heat treatment enables separation of the single-crystal silicon substrate 20 from the supporting substrate and forms a silicon oxide film 3 with a thickness of approximately 400 nm and a single-crystal silicon layer 2 with a thickness of approximately 200 nm. FIG. 7(e) is a cross-sectional view of the separated SOI substrate. Since the SOI substrate is a single-crystal silicon layer having a surface with unevenness of several nanometers, it must be planarized. In this embodiment, the substrate surface was finely polished by contact polishing using a CMP process (the polished thickness is less than 10 nm). Planarization may also be achieved by a hydrogen annealing process including heat treatment in a hydrogen atmosphere. The resulting SOI substrate has a single-crystal silicon layer having a satisfactorily uniform thickness, and a light shielding layer which can suppress light leakage of a device will be produced.

Third Embodiment

Figure 8:
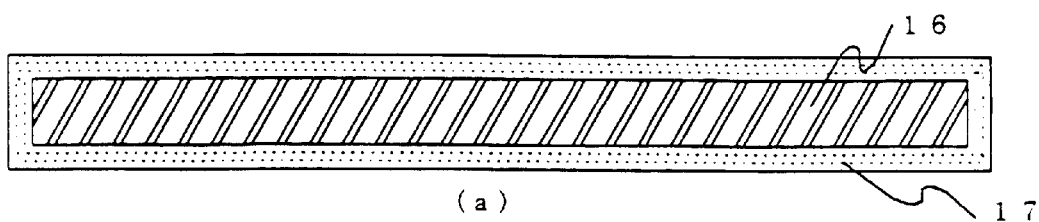
FIGS. 8(a)–(c) show production steps of an SOI substrate in accordance with a third embodiment of the present invention.
Figure 8:
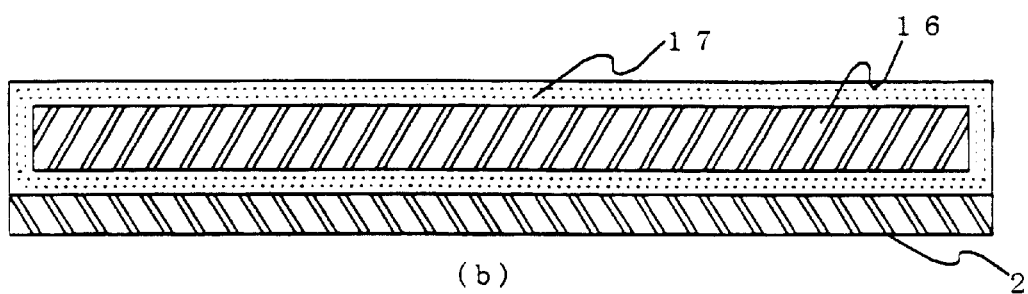
Figure 8:
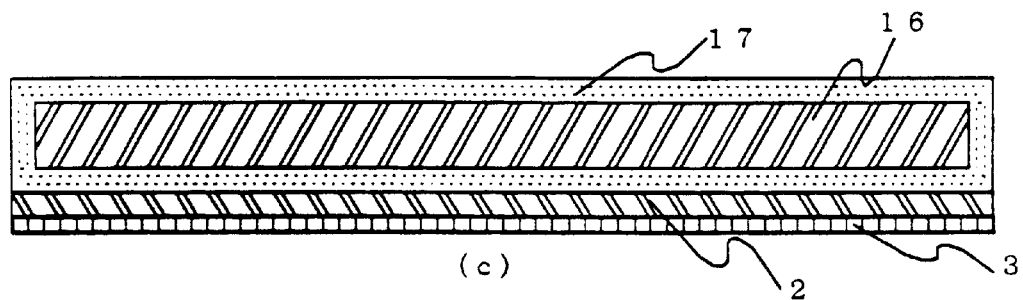
Figure 9:
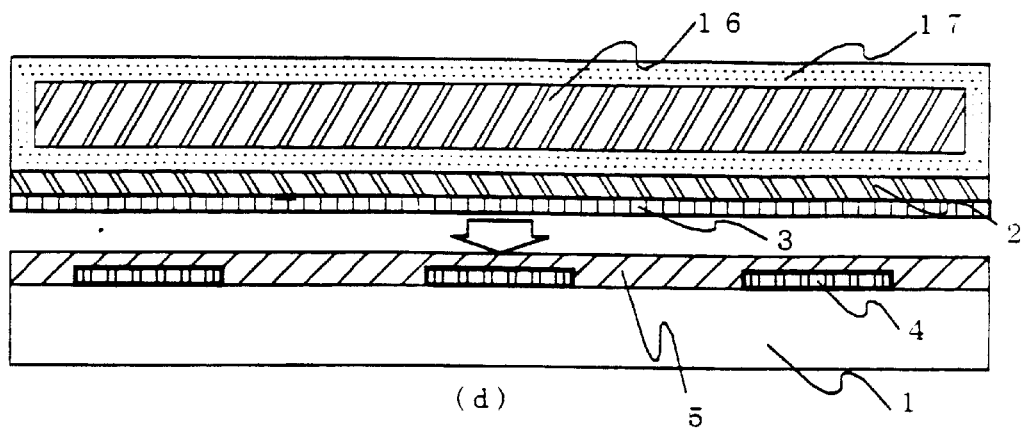
FIGS. 9(d)–(f) show production steps of an SOI substrate in accordance with a third embodiment of the present invention.
Figure 9:
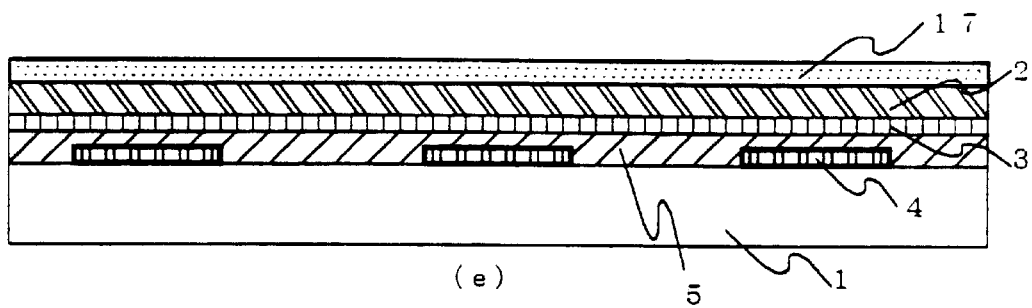
Figure 9:
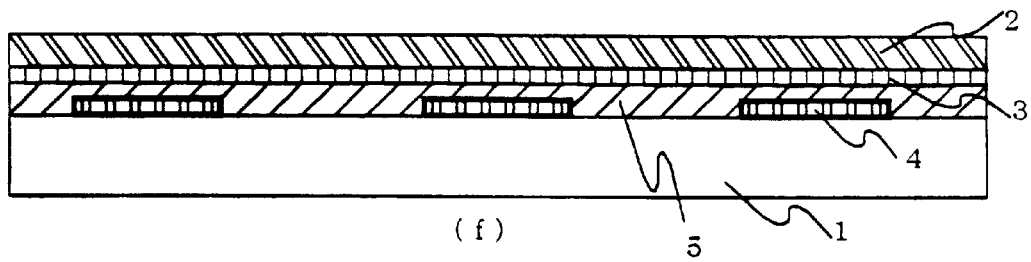

FIGS. 8(a)–(c) and 9(d)–(f) show a third embodiment in accordance with the present invention. The same reference numerals as those in FIGS. 4(a)–6(c) represent the same layers or parts formed by the same steps. In this embodiment, the planarization step of the surface of a supporting substrate with a patterned light shielding layer and the preceding steps are entirely the same as those in the first embodiment. FIG. 8(a) shows a silicon substrate for forming a single-crystal silicon layer for bonding. A silicon substrate 16 has a thickness of 600 μm, and the surface thereof is converted to a porous layer 17 by anodic oxidation in a HF-ethanol solution. The single-crystal silicon substrate 16 provided with the porous surface with a thickness of 12 μm is subjected to heat treatment in a hydrogen atmosphere at 1,050° C. to planarize the surface of the porous layer 17, in order to reduce the defect density in the single-crystal silicon layer formed on the silicon substrate 16, and to improve the quality. With reference to FIG. 8(b), a single-crystal silicon layer 2 is formed by epitaxial growth on the planarized porous silicon layer 17 on the surface of the silicon substrate 16. The thickness of the single-crystal silicon layer deposited by the epitaxial growth is 500 nm in this embodiment, but the thickness has no limitative significance in the present invention. The thickness of the single-crystal silicon layer may be determined without limitation corresponding to the device to be produced. With reference now to FIG. 8(c), the surface of the single-crystal silicon layer 2 is oxidized by 50 to 400 nm to form an oxide layer 3 which will function as an embedding oxide film of the SOI substrate after bonding. With reference to FIG. 9(d), the substrate provided with the single-crystal silicon layer 2 and the oxide layer 3 is bonded to a supporting substrate 1 provided with a light shielding layer 4 and an insulating layer 5. Bonding may be performed by a direct bonding process of these two substrates, for example, at 300° C. for 2 hours. With reference to FIG. 9(e), the silicon substrate is polished so that the surface oxide layer 3, the single-crystal silicon layer 2, and the porous silicon layer 17 remain at the bonding face. With reference now to FIG. 9(f), the porous silicon layer 17 is removed by etching to form a single-crystal silicon layer 2 on the supporting substrate. In the etching of the porous silicon layer 17, an etching solution having a composition of HF/H$_2$O$_2$ shows high selectivity of the porous silicon layer 17 compared with the single-crystal silicon layer 2; hence only the porous silicon layer can be entirely removed while maintaining a significantly uniform thickness of the single-crystal silicon. Since the surface of the single-crystal silicon layer 2 of the SOI substrate after removing the porous silicon layer 17 has unevenness of several nanometers, it must be planarized. In this embodiment, hydrogen annealing including heat treatment in a hydrogen atmosphere is used. The planarization may also be achieved by contact polishing using a CMP process which finely polishes the surface of the single-crystal silicon layer 2 of the SOI substrate (the polished thickness is less than 10 nm). The resulting SOI substrate has a single-crystal silicon layer having a satisfactorily uniform thickness, and a light shielding layer which can suppress light leakage of a device will be produced.

Fourth Embodiment

Figure 10:
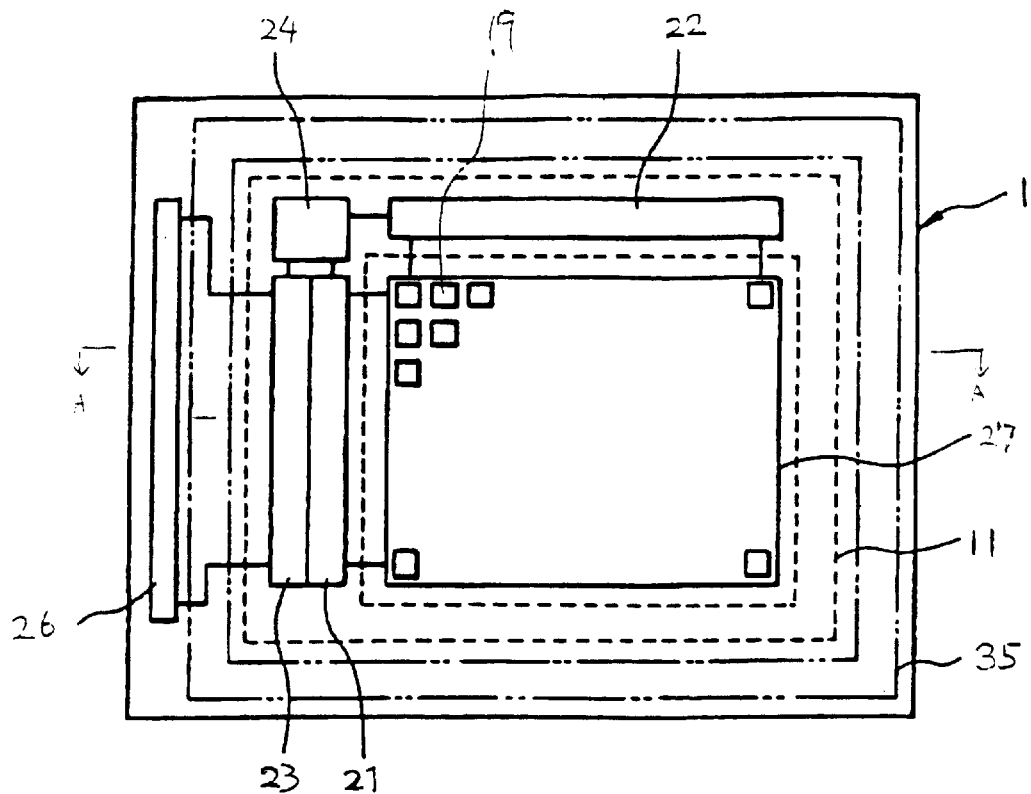
FIG. 10 is a plan view of liquid crystal panel in accordance with a fourth embodiment of the present invention.

FIG. 10 is a plan layout view of a transmissive liquid crystal panel as a preferred embodiment of devices using the SOI substrate produced in accordance with the present invention. In the drawing, portions unnecessary for description are omitted to facilitate understanding, and the drawing is schematically depicted.

As shown in FIG. 10, a display pixel region 27 is provided on a transparent substrate 1, and pixel electrodes 19 are arranged in a matrix. Driving circuits for processing display signals are formed at the periphery of the display pixel region 27. A gate line driving circuit 21 sequentially scans in the gate signal lines, and a data line driving circuit 22 supplies image signals to source signal lines in response to the image data. An input circuit 23 for storing the image data from the exterior through a pad region 26 and a timing controlling circuit 24 for controlling these circuits are also provided. All these circuits comprise combinations of MOSFETs as active devices or switching devices, which are formed by the same step as, or a different step from, that for the MOSFETs for switching pixel electrodes, with load devices, such as resistors and capacitors.

Figure 11:
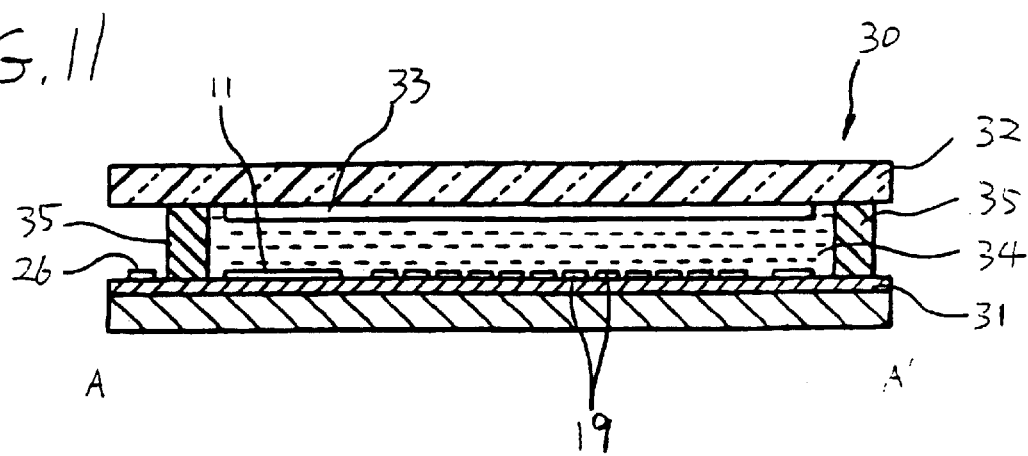
FIG. 11 is a plan view of liquid crystal panel in accordance with a fourth embodiment of the present invention.

FIG. 11 is a cross-sectional view of the liquid crystal panel taken from line A–A' in FIG. 10. As shown in FIG. 11, in the liquid crystal panel, a substrate 31 provided with display pixels and driving circuits and a transparent substrate 32 provided with an opposite electrode 33 composed of a transparent conductive film (ITO) to which an LC common potential is applied, are disposed at a predetermined distance, and the peripheries are sealed with a sealant 35. The gap is filled with a known twisted nematic (TN) liquid crystal 34 or a super homeotropic (SH) liquid crystal in which liquid crystal molecules are substantially vertically oriented when no voltage is applied, to form a liquid crystal panel 30. The position of the sealant is determined so that the pad region 26 lies at the exterior of the sealant 35 in order to achieve input of external signals.

Figure 12:
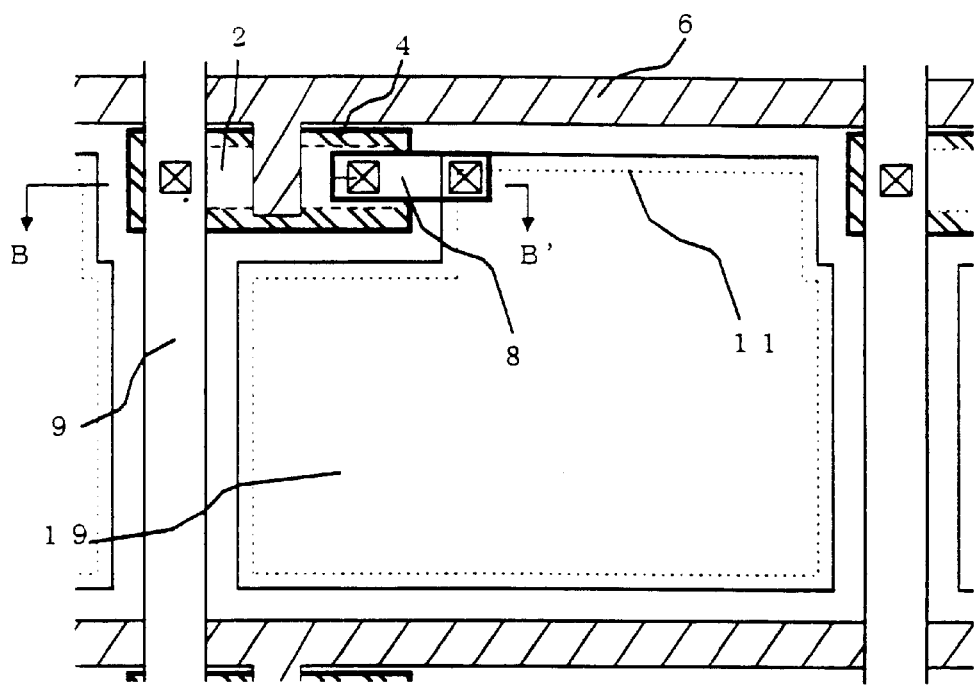
FIG. 12 is a planar layout view of a display pixel section produced on a substrate of the liquid crystal panel in accordance with the fourth embodiment of the present invention.

FIG. 12 is an enlarged plan view of a pixel section of a transparent liquid crystal panel using the SOI substrate produced in accordance with the present invention. Each pixel is provided with a MOSFET as a transistor device for controlling writing of charges into the pixel. Each pixel is provided with a single-crystal silicon layer 2 which functions as a channel region, a source region, and a drain region to form the MOSFET. One terminal is connected to a gate line, another terminal is connected to a source line, and the other terminal is connected to a drain electrode 8 connected to a pixel electrode 19 of the display pixel. An upper light shielding layer 11 is also formed for light shielding the channel region in the MOSFET and for preventing light leakage between display pixels. The most significant advantage of the liquid crystal panel is a configuration in which a light shielding layer 4 formed during the production of the SOI substrate is provided under all of the MOSFET for controlling each display pixel, and the MOSFET forming region for constituting the image signal processing circuit, the input circuit, and the timing controlling circuit.

Figure 13:
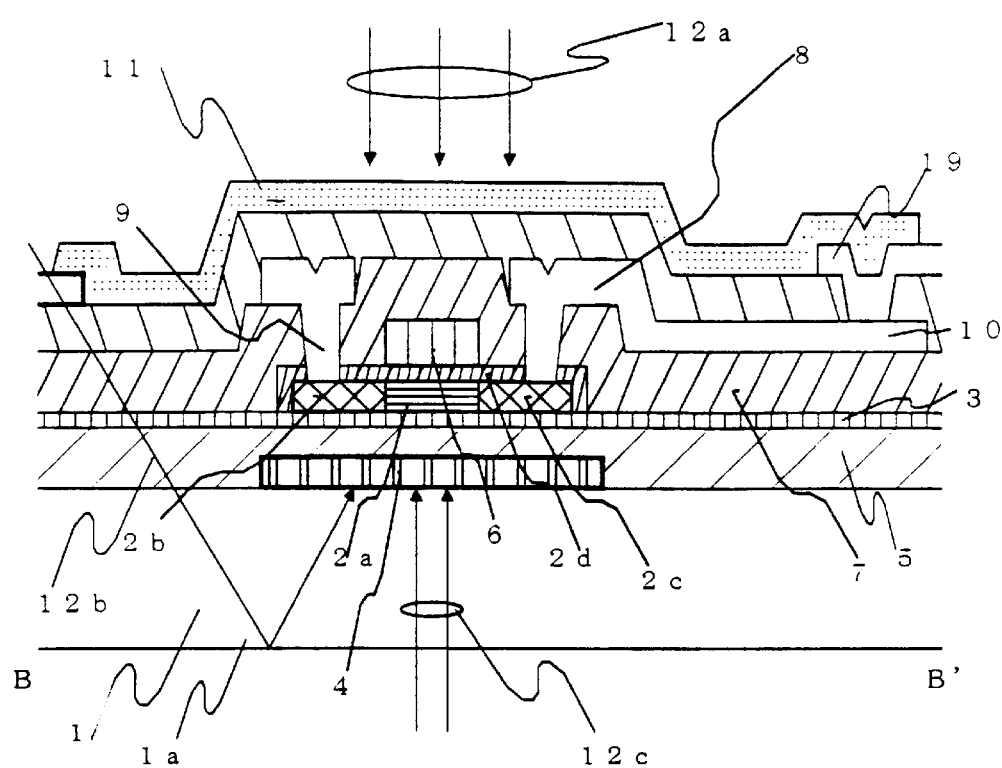
FIG. 13 is a cross-sectional view of a MOSFET produced on the liquid crystal panel in accordance with the fourth embodiment of the present invention.

This will be described in more detail with reference to FIG. 13. FIG. 13 shows a cross-sectional configuration taken from line B–B' of the MOSFET provided in the display pixel region shown in FIG. 12. A light shielding layer 4 is provided between the channel region 2a of a MOSFET and a transparent supporting substrate 1 so as to cover the channel region 2a, and this configuration can entirely shield light incident on the rear side of the substrate. For example, the light shielding layer 4 in accordance with the present invention effectively shields light 12c directly incident on the rear face of the substrate and light 12b reflected on the rear face, which are not shielded by conventional SOI configurations. Although an exemplary light shielding layer was described for the MOSFET configuration in the display pixel region, this configuration is also applied to the MOSFET in the driving circuit formed on the periphery of the display pixel area.

An oxide layer 3 is formed on the supporting substrate 1 provided with the light shielding layer 4 and the insulating layer 5, and a source region 2b, a channel region 2a, and a drain region 2c are formed in the MOSFET by patterning the single-crystal silicon layer. The single-crystal silicon region is covered with a gate insulating film 2d formed by surface oxidation thereof. A gate electrode 6 is provided on the gate insulating film 2d, and the single-crystal silicon region of the MOSFET and the gate electrode 6 are covered with a first interlayer 7. The source region 2b and the drain region 2c are connected to a source line 9 and a drain line 8, respectively, through openings in the first interlayer 7. Furthermore, a second interlayer 10 is formed thereon, and an upper light shielding layer 11 and a pixel electrode 19 are formed on the second interlayer 10. The pixel electrode 19 is connected to the drain electrode 8 through an opening in the second interlayer 10. The upper light shielding layer 11 is composed of a nontransparent insulating material, such as a black polyimide resin, to prevent light leakage between the pixel electrodes.

In the above-described embodiment, a transmissive liquid crystal panel was described as an example. The present invention is, however, not limited to the described application, and is applicable to various semiconductive devices, such as other display devices using transmissive display modes and image input devices for reading optical information. In this case, transistor devices and the like for driving the above-mentioned semiconductive device may be formed on the light shielding layer provided on the SOI substrate, as described in the above embodiments.

The pattern of the light shielding layer is determined by the arrangement of transistors formed thereon, hence the bonding step of the substrates is preferably included as a part of a production process for a required semiconductive device. Such integration of the substrate fabrication process and the device production process enables construction of an overall process using a high-performance substrate satisfying the needs of the device, and facilitates higher performance of the device and reduction in process cost.

Industrial Applicability

As described above, the SOI substrate in accordance with the present invention is provided with a light shielding layer between a transparent supporting substrate and a semiconductive thin film formed thereon, hence it can prevent light leakage to the transistor device forming region due to light directly incident on the rear face of the substrate and light reflected on the rear face of the substrate. Accordingly, the SOI substrate in accordance with the present invention enables production of devices for optical use.

What is claimed is:

1. A method of making an SOI substrate comprising:
providing a transparent supporting substrate,
forming a light shielding layer above one surface of the supporting substrate,
patterning the light shielding layer so as to cover at least a channel region of a transistor device,
forming an insulating layer above the light shielding layer,
planarizing a surface of the insulating layer,
bonding a single-crystal silicon layer to the planarized surface of the insulating layer, and
patterning the single-crystal silicon layer.

2. The method according to claim 1, further comprising:
prior to bonding the single-crystal silicon layer, thermally oxidizing the single-crystal silicon layer to form a silicon oxide film on the single-crystal silicon layer, and
in bonding the single-crystal silicon layer, the silicon oxide film is bonded to the insulating layer.

3. The method according to claim 2, the silicon oxide film having a thickness of 0.05 to 0.8 µm.

4. A method of making an SOI substrate comprising:
providing a transparent supporting substrate,
forming a light shielding layer above one surface of the supporting substrate,
patterning the light shielding layer,
forming an insulating layer above the light shielding layer,
planarizing the surface of the insulating layer wherein the light shielding layer is covered by the insulating layer,
bonding a single-crystal silicon layer to the planarized surface of the insulating layer by a thermal treatment at a predetermined temperature,
etching the single-crystal silicon layer, and
subjecting the single-crystal silicon layer to another thermal treatment at a higher temperature than the predetermined temperature after etching the single-crystal silicon layer.

5. The method according to claim 4, the single-crystal silicon layer being thinned to a thickness of 100 to 150 µm.

6. The method according to claim 4, further comprising implanting hydrogen ions to the single-crystal silicon layer.

* * * * *